(12) United States Patent
Huang et al.

(10) Patent No.: US 11,239,111 B1
(45) Date of Patent: Feb. 1, 2022

(54) METHOD OF FABRICATING SEMICONDUCTOR DEVICE

(71) Applicant: NANYA TECHNOLOGY CORPORATION, New Taipei (TW)

(72) Inventors: Chih-Wei Huang, Taoyuan (TW); Hsu-Cheng Fan, Taoyuan (TW); En-Jui Li, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/037,583

(22) Filed: Sep. 29, 2020

(51) Int. Cl.
   *H01L 21/768*   (2006.01)
   *H01L 21/311*   (2006.01)
   *H01L 27/108*   (2006.01)

(52) U.S. Cl.
   CPC .... *H01L 21/7682* (2013.01); *H01L 21/76831* (2013.01); *H01L 21/76832* (2013.01); *H01L 27/10855* (2013.01); *H01L 21/31116* (2013.01)

(58) Field of Classification Search
   CPC ......... H01L 21/76831; H01L 21/76834; H01L 21/7682; H01L 21/311116; H01L 21/31059; H01L 21/76832
   See application file for complete search history.

(56) References Cited

U.S. PATENT DOCUMENTS

2014/0077333 A1* 3/2014 Son ................... H01L 27/10885 257/522
2018/0174971 A1* 6/2018 Song ................. H01L 27/10823

\* cited by examiner

*Primary Examiner* — Thanhha S Pham
(74) *Attorney, Agent, or Firm* — CKC & Partners Co., LLC

(57) ABSTRACT

A method of fabricating a semiconductor device includes forming a first conductive structure over a substrate, successively forming a first spacer layer, a sacrificial layer, and a second spacer layer on the first conductive structure, forming a second conductive structure adjacent the first conductive structure and in contact with a lower portion of the second spacer layer, partially removing an upper portion of the second spacer layer to expose the sacrificial layer, removing the sacrificial layer through a vapor etch process to form an air gap between the lower portion of the second spacer layer and the first spacer layer, and forming a capping layer to cap the air gap.

19 Claims, 13 Drawing Sheets

METHOD OF FABRICATING SEMICONDUCTOR DEVICE

BACKGROUND

Field of Invention

The present disclosure relates to a method of fabricating a semiconductor device. More particularly, the present disclosure relates to a method of fabricating a semiconductor device with an air gap as a spacer.

Description of Related Art

Smaller and lighter electronics devices have driven semiconductor devices shirked with a high degree of integration. Thus, the distance between conductive structures within semiconductor devices has gradually decreased. The parasitic capacitance between conductive structures is consequently increased. With an increase of parasitic capacitance, the operation speed of semiconductor devices is reduced, or refresh characteristic of semiconductor devices is degraded.

SUMMARY

The disclosure provides a method of fabricating a semiconductor device. In an embodiment, a method of fabricating a semiconductor device includes forming a first conductive structure over a substrate, successively forming a first spacer layer, a sacrificial layer, and a second spacer layer on the first conductive structure, forming a second conductive structure adjacent the first conductive structure and in contact with a lower portion of the second spacer layer, partially removing an upper portion of the second spacer layer to expose the sacrificial layer, removing the sacrificial layer through a vapor etch process to form an air gap between the lower portion of the second spacer layer and the first spacer layer, and forming a capping layer to cap the air gap.

In another embodiment, a method of fabricating semiconductor includes forming bit line structures over a substrate, forming a sacrificial layer on a surface of the bit line structures, forming a contact plug between the bit line structures, removing the sacrificial layer through a vapor etch process to form air gaps between the bit line structures and the contact plug, and forming a capping layer to cap an entrance of each of the air gaps.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
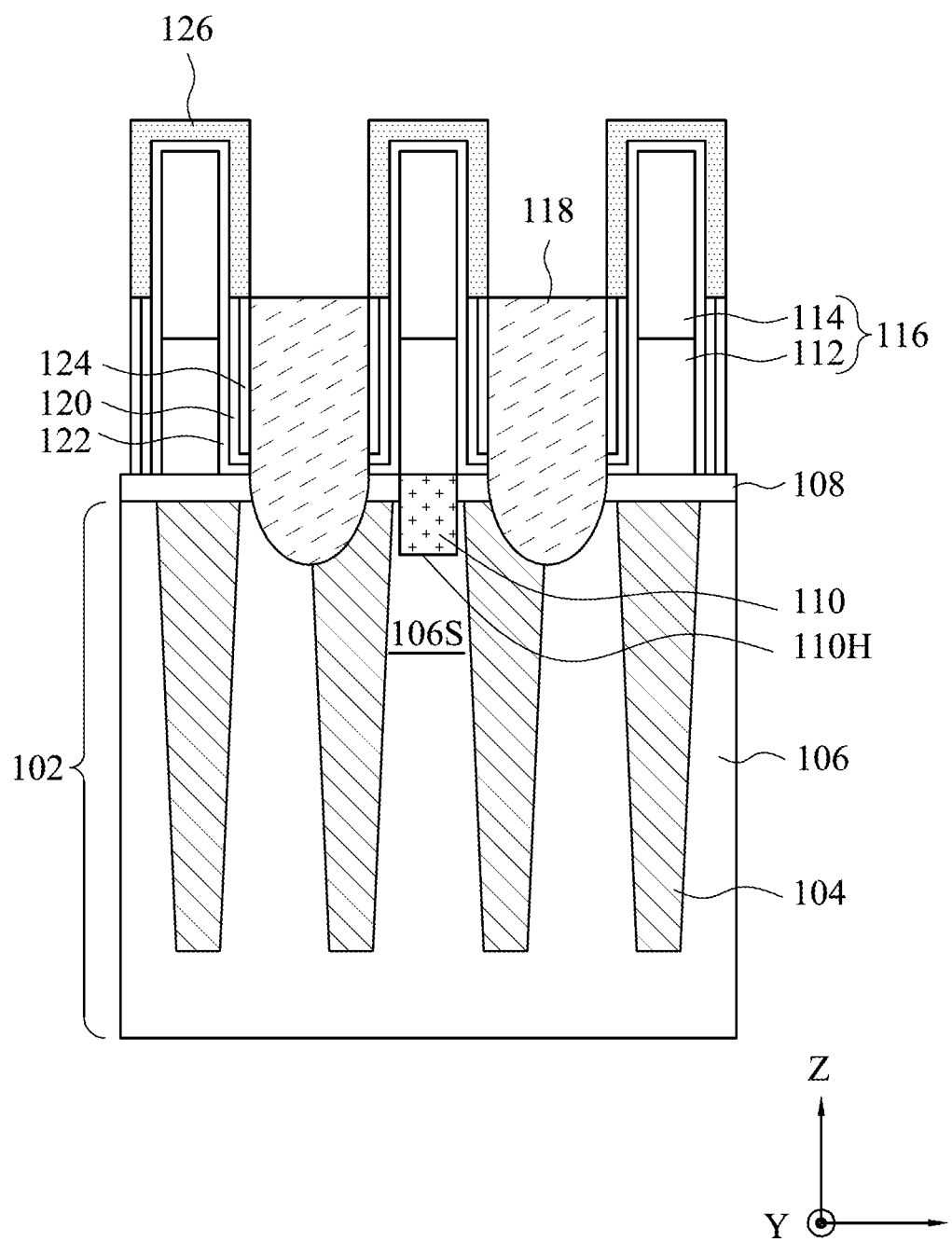
FIG. 1 is a cross-sectional view illustrating a portion of a semiconductor device in accordance with an embodiment of the present disclosure.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It will be understood that when an element is referred to as being "on" another element, it can be directly on the other element or intervening elements may be presented therebetween. In contrast, when an element is referred to as being "directly on" another element, there are no intervening elements present. As used herein, the term "and/or" includes any and all combinations of one or more of the associated listed items.

Reference will now be made in detail to the present embodiments of the disclosure, examples of which are illustrated in the accompanying drawings. Wherever possible, the same reference numbers are used in the drawings and the description to refer to the same or like parts.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

FIG. 1 is cross-sectional view illustrating a portion of a semiconductor device in accordance with an embodiment of the present disclosure.

Referring to FIG. 1, a plurality of semiconductor structures 100 are formed over a substrate 102. The substrate 102 includes a plurality of isolation areas 104 and a plurality of active areas 106. The active areas 106 are spaced apart by the isolation areas 104.

An insulation layer 108 with at least one opening 110H is formed on the substrate 102 and covers a top surface of the isolation areas 104 and the active areas 106 of the substrate 102. The insulation layer 108 may include silicon oxide, for example, tetraethylorthosilicate (TEOS), high density plasma (HDP), or boro-phospho silicate glass (BPSG).

The opening 110H may expose at least one active area among the active areas 106 of the substrate 102 during a process of forming the insulation layer 108. The opening 110H is then filled with a conductive material to form a direct contact 110. At least one active area which contacts the direct contact 110 may be referred to as a source area 106S. The direct contact 110 may be electrically connected to the source area 106S.

The semiconductor structures 100 include a plurality of first conductive structures 116 above the substrate 102. The first conductive structure 116 further includes two portions along a vertical direction substantially perpendicular to the substrate 102 (e.g., along Z direction): a first conductive layer 112 at bottom portion, and an insulation capping layer 114 at top portion. A plurality of second conductive layers 118 are formed between adjacent first conductive structures 116. A plurality of air gaps 120 are formed between the first conductive layers 112 and the second conductive layers 118, and is within a confined space configured by a first spacer layer 122, a second spacer layer 124 and a capping layer 126. The air gaps 120 with a dielectric constant of approximate 1 reduce parasitic capacitance between the first conductive layers 112 and second conductive layers 118.

In some embodiments, each of the first conductive structures 116 includes a line-shaped structure, and each of the second conductive layers 118 includes a plug-shaped structure. The first conductive structures 116 may be regularly arranged at substantially equal intervals from each other over the substrate 102. In some embodiments, the first conductive structure 116 is a bit line structures and the second conductive layer 118 is a contact plug structure.

FIGS. 2A to 2L are cross-sectional views illustrating different steps of a method of fabricating the semiconductor structures 100 in accordance with an embodiment of the present disclosure.

Figure 2A:
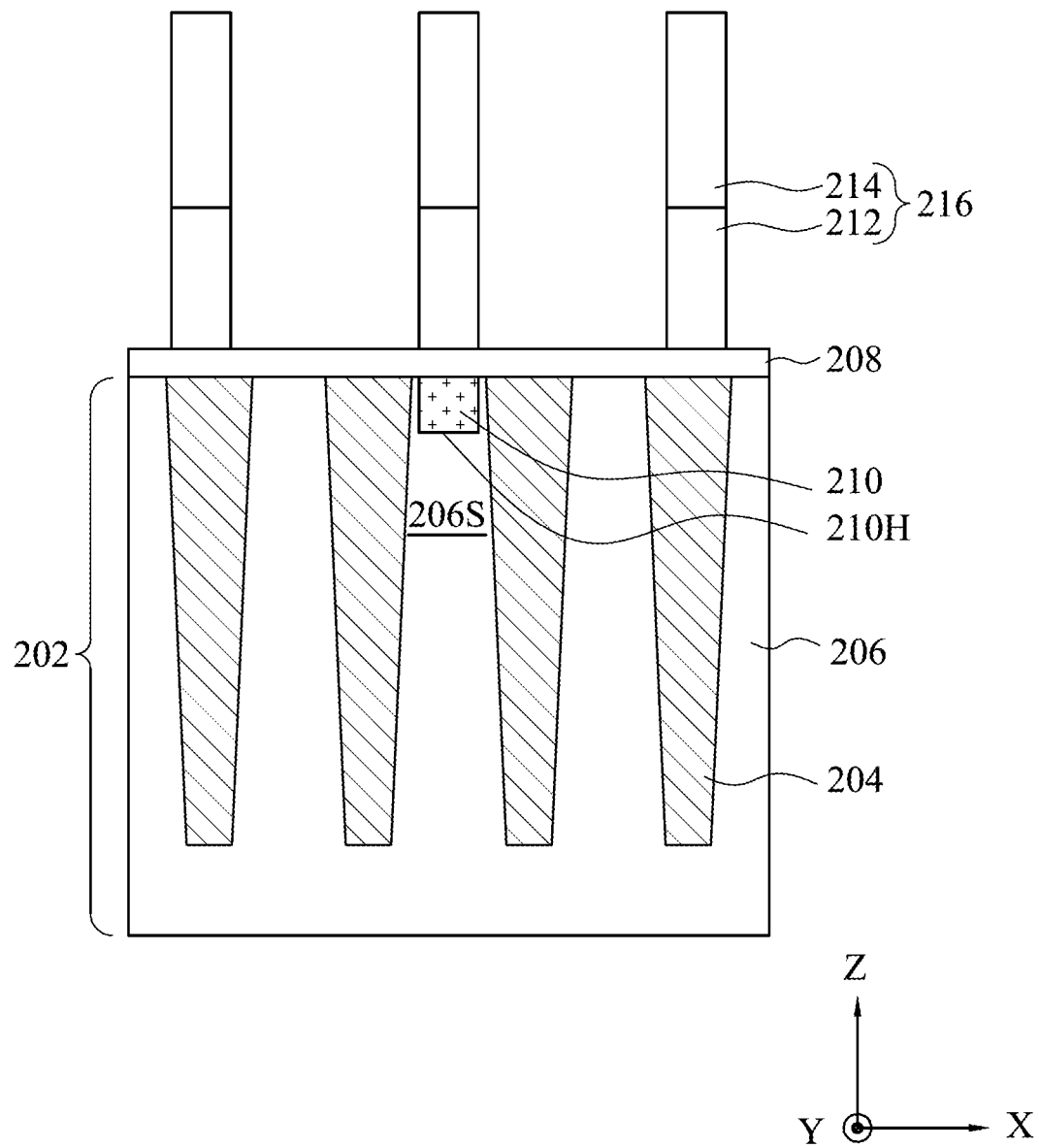
FIGS. 2A to 2L are cross-sectional views illustrating different steps of a method of fabricating a semiconductor device in accordance with an embodiment of the present disclosure.

Referring to FIG. 2A, a plurality of first conductive structures 216 are formed over a substrate 202.

The substrate 202 includes a plurality of isolation areas 204 and a plurality of active areas 206. The active areas 206 are spaced apart by the isolation areas 204. The substrate 202 may include, for example, silicon (e.g., crystalline silicon, polycrystalline silicon, or amorphous silicon). In some embodiments, the substrate 202 may include other elementary semiconductor such as germanium. In some embodiments, the substrate 202 may include an alloy semiconductor such as silicon germanium, silicon germanium carbide, gallium indium phosphide and the like. In some embodiments, the substrate 202 may include compound semiconductor such as gallium arsenic, silicon carbide, indium phosphide, indium arsenide and the like. Further, the substrate 202 may optionally include a semiconductor-on-insulator (SOI) structure.

The isolation areas 204 may be formed through a shallow trench isolation (STI) process. The isolation areas 204 may include, for example, a material including at least one of silicon oxide, silicon nitride, and silicon oxynitride. The isolation areas 204 may be a single layer including one kind of insulator, a double layer including two kinds of insulators, or a multilayer including a combination of at least three kinds of insulators. For example, the isolation areas 204 may include silicon oxide and silicon nitride. For example, the isolation areas 204 may include a triple layer including silicon oxide, silicon nitride, and silicon oxynitride.

An insulation layer 208 with at least one opening 210H is formed on the substrate 202 and covers a top surface of the isolation areas 204 and the active areas 206 of the substrate 202.

The opening 210H may expose at least one active area among the active areas 206 of the substrate 202 during a process of forming the insulation layer 208. The opening 210H is then filled with a conductive material to form a direct contact 210. At least one active area which contacts the direct contact 210 may be referred to as a source area 206S. The direct contact 210 may be electrically connected to the source area 206S.

A plurality of first conductive structures 216 are formed over the substrate 202. The first conductive structure 216 may further include two portions along a vertical direction substantially perpendicular to the substrate 202 (e.g., along Z direction): a first conductive layer 212 at bottom portion, and an insulation capping layer 214 at top portion.

The formation of the first conductive layer 212 and the insulation capping layer 214 may include forming a conductive material layer and an insulation capping material layer sequentially over the substrate 202. The insulation capping material layer may be formed on the first conductive material layer. In one embodiment, both of the first conductive material layer and the insulation capping material layer may be substantially simultaneously etched to form the first conductive layer 212 and the insulation capping layer 214.

Thus, the first conductive structure 216 including the first conductive layer 212 and the insulation capping layer 214 may be spaced apart from each other in a first direction (e.g., the X direction) and extend in parallel with each other along a second direction (e.g., the Y direction). In yet another embodiment, the insulation capping material layer is etched with desirable patterned and formed as a mask pattern on the first conductive material layer. Using the patterned insulation capping material layer as an etch mask, the first conductive material layer is etched to form the first conductive layer 212.

In some embodiments, the first conductive layer 212 includes at least one material selected from semiconductor with impurities doped thereon, metal, conductive metal nitride, and metal silicide. In some embodiments, the first conductive layer 212 may have a stacked structure. For example, the first conductive layer 212 may be stacked with materials including doped polysilicon as well as metal nitride or metal such as tungsten, tungsten nitride, and/or titanium nitride. The first conductive layer 212 may be electrically connected to the direct contact 210.

In some embodiments, the insulation capping layer 214 includes silicon nitride. A thickness of the insulation capping layer 214 may be greater than that of the first conductive layer 212.

The first conductive structures 216 may be regularly arranged at substantially equal intervals from each other over the substrate 202. In some embodiments, the first conductive structures 216 are a plurality of bit line structures.

Figure 2B:
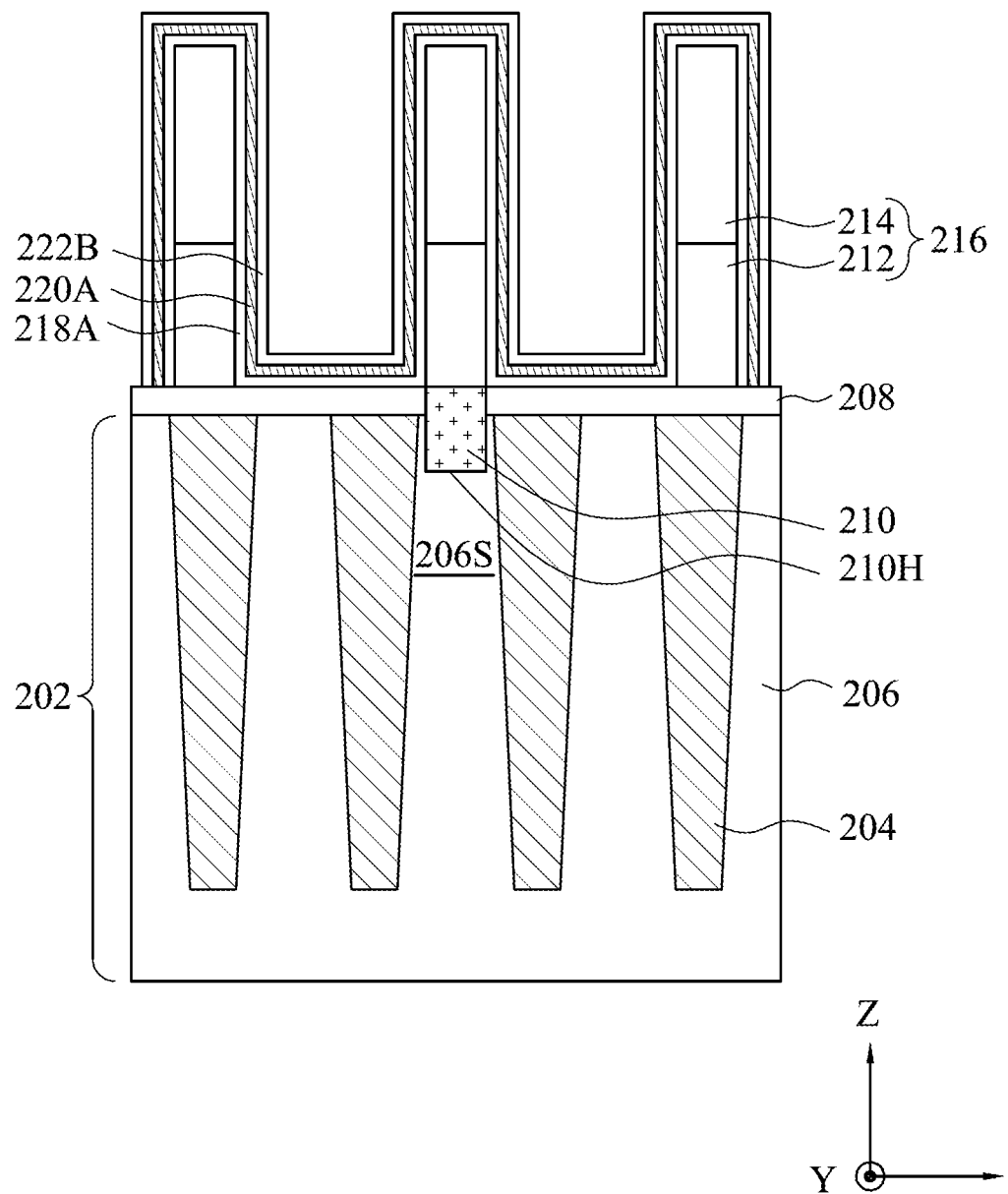

Referring to FIG. 2B, a first spacer layer 218A, a sacrificial layer 220A and a second spacer layer 222B are successively formed over a entire surface of the first conductive structure 216 and on a top surface of the insulation layer 208 which is not covered by the first conductive structures 216. In other words, the first spacer layer 218A is conformally formed onto sidewalls of the first conductive layer 212, sidewalls of the insulation capping layer 214, a top surface of the insulation capping layer 214, and the top surface of the insulation layer 208 which is not covered by the first conductive structures 216. Then, the sacrificial layer 220A is conformally formed onto the forming coverage of the first spacer layer 218A (i.e., sidewalls of the first conductive layer 212, sidewalls of the insulation capping layer 214, the top surface of the insulation capping layer 214, and the top surface of the insulation layer 208 which is not covered by the first conductive structures 216. Subsequently, the second spacer layer 222B is conformally formed onto the forming coverage of sacrificial layer 220A and becomes an outermost layer. Thus, the sacrificial layer 220A is sandwiched between the first spacer layer 218A and the second spacer layer 222B. The first spacer layer 218A, the sacrificial layer 220A, and the second spacer layer 222B may be formed by any suitable approaches such as chemical vapor deposition (CVD) techniques, plasma-enhanced CVD (PECVD) techniques, atomic layer deposition (ALD), or physical vapor deposition (PVD) techniques.

The sacrificial layer 220A may have an etch selectivity with respect to the first spacer layer 218A and/or the second spacer layer 222B. In other words, during the same etching process, an etching rate on the sacrificial layer 220A is faster than that on the first spacer layer 218A and/or that on the second spacer layer 222B. In some embodiments, the first spacer layer 218A and the second spacer layer 222B include silicon nitride, and the sacrificial layer 220A includes oxide.

Based on the disclosure herein, other materials, as discussed above, can be used. These materials are within the spirit and scope of this disclosure.

The sacrificial layer 220A would be removed to form an air gap in a subsequent process. In some embodiments, the thickness of the sacrificial layer 220A may be less than about 2 nm, and consequently the thickness of the air gap may be less than about 2 nm.

Figure 2C:
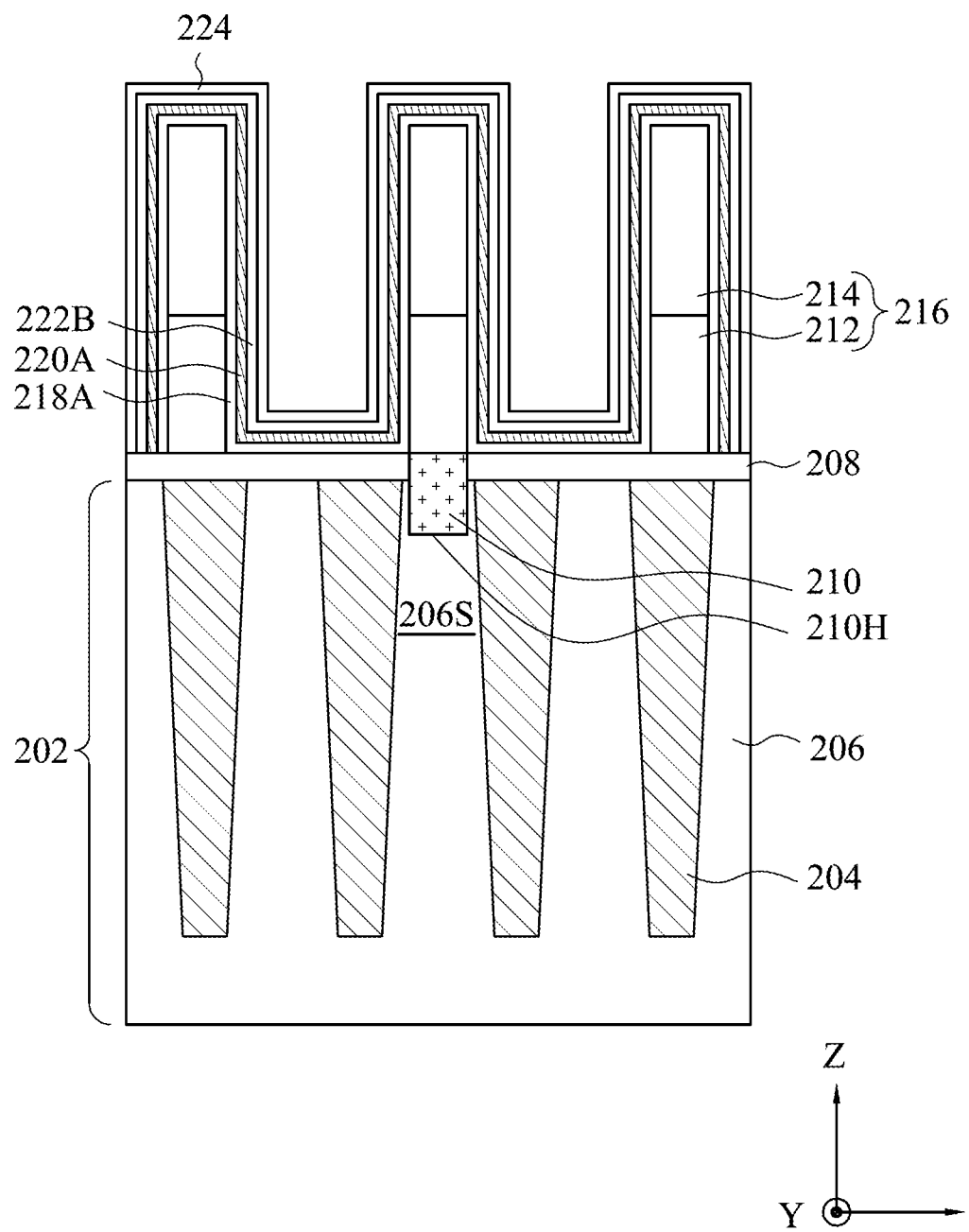

Referring to FIG. 2C, a protection layer 224 is formed. The protection layer 224 is conformally formed over the entire surface of the resulting structure, that is, over the forming coverage of the second spacer layer 222B. In some embodiments, the protection layer 224 includes polysilicon. The protection layer 224 may be formed by any suitable approaches such as low pressure CVD techniques.

Figure 2D:
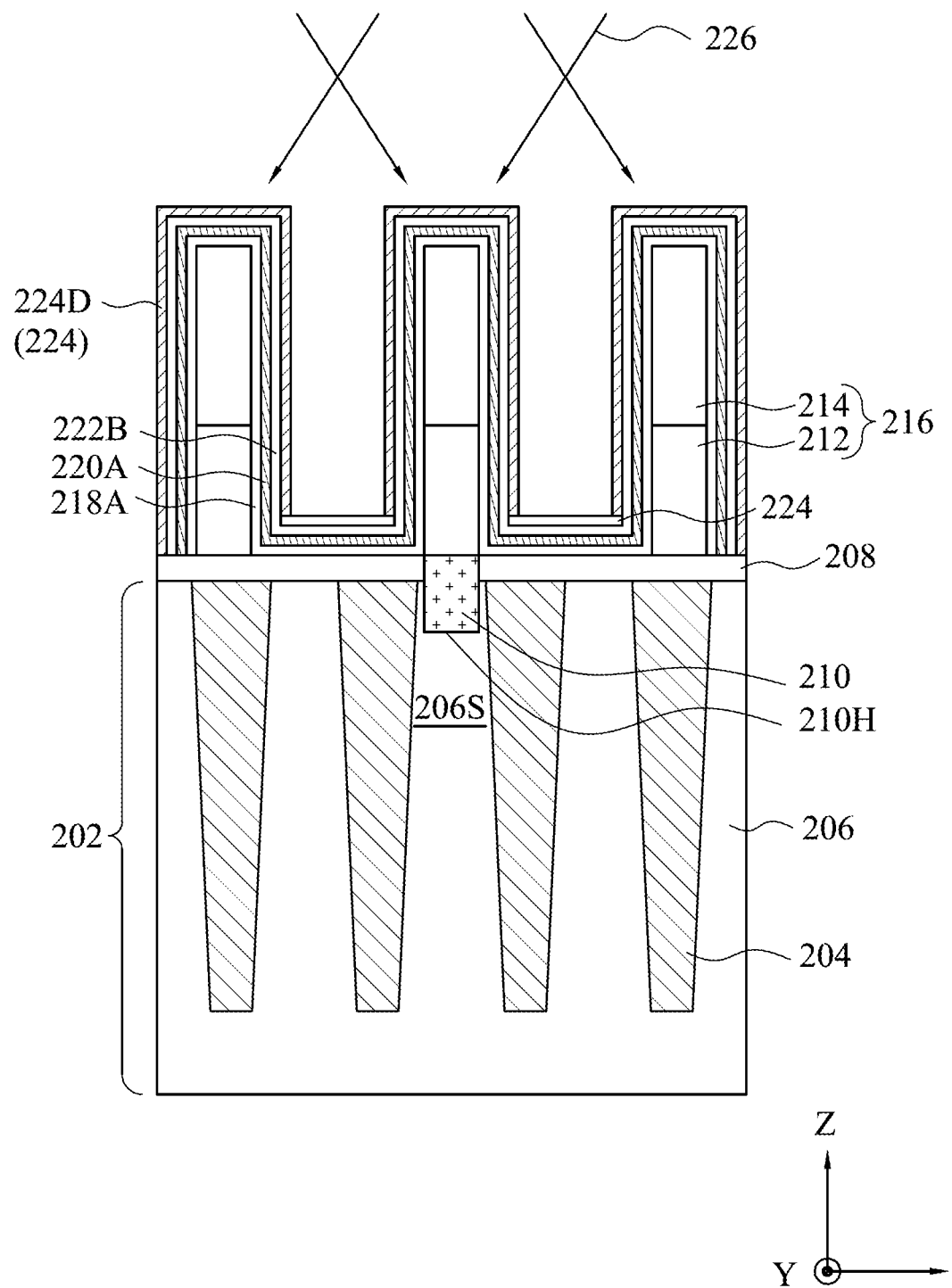

Referring to FIG. 2D, an ion implant process 226 is performed over the protection layer 224. During the ion implant process 226, a plurality of predetermined dopants may be implanted into the protection layer 224 at a range of incident angles so that a doped protection layer 224D is formed around the first conductive structure 216. In other words, to direct the dopants on a top surface of the first conductive structure 216 and at least one sidewall of the first conductive structure 216, the dopants are incident at a range of angles that are oblique relative to the surface of the substrate 202 (e.g., oblique relative to X-Y plane). Accordingly, a portion of the protection layer 224 on the insulation layer 208 which is no covered by the first conductive structure 216 could remain original composition.

The protection layer 224 may have an etch selectivity with respect to the doped protection layer 224D which remains original composition on the insulation layer 208 without covered by the first conductive structure 216. In other words, in the subsequent process, the removing rate on the protection layer 224 is faster than that on the doped protection layer 224D. In some embodiments, boron-type dopants are included in the ion implant process 226. In some embodiments, the doped protection layer 224D comprises boron-doped polysilicon. Based on the disclosure herein, other materials, as discussed above, can be used.

Figure 2E:
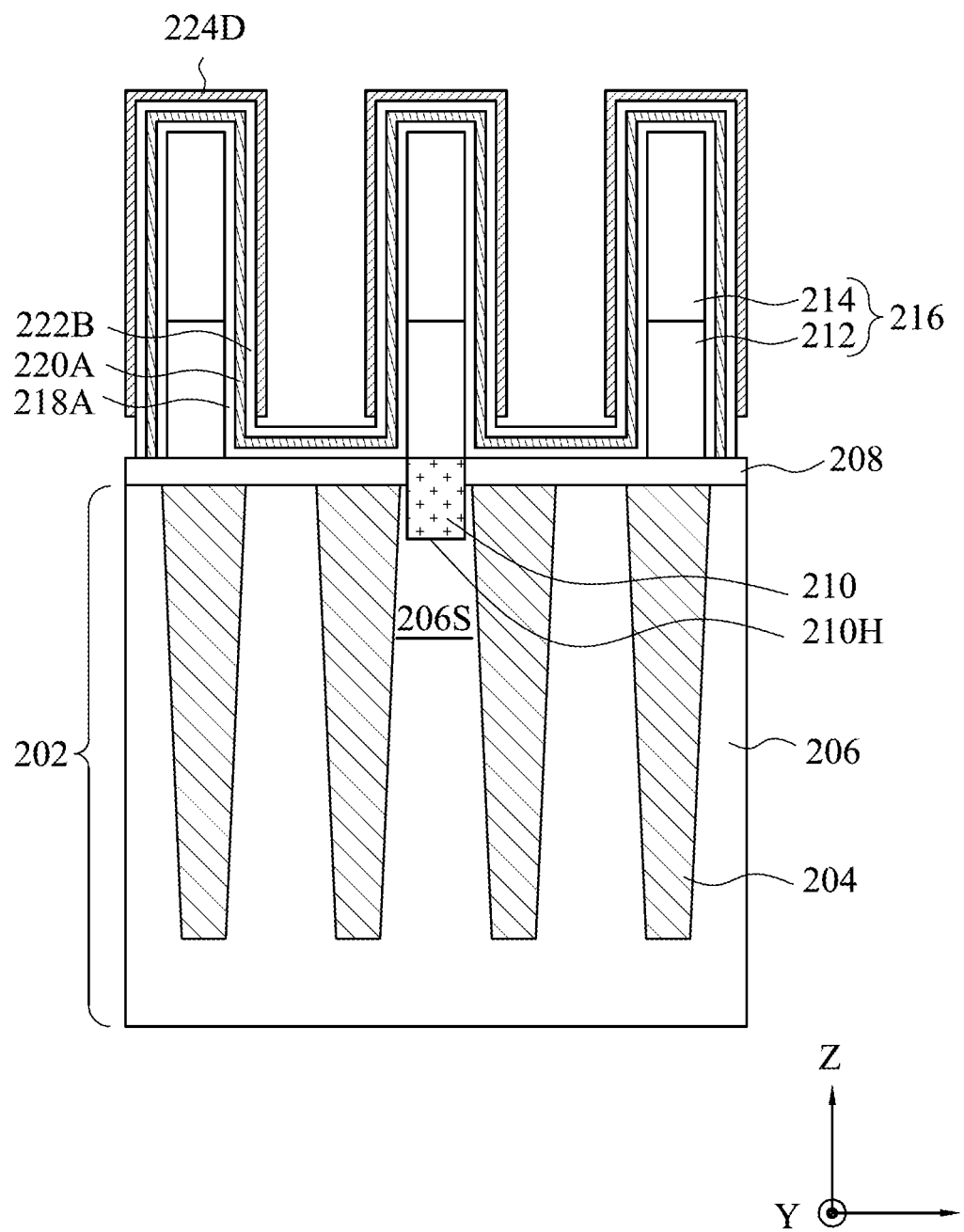

Referring to FIG. 2E, an etching process that has high etching selectivity to the doped protection layer 224D and the protection layer 224 is performed. The protection layer 224 which remains original composition on the insulation layer 208 without covered by the first conductive structure 216 is removed, and the doped protection layer 224D is remained. In some embodiments, a dry etching with an etching selectivity is performed during this operation. As a result, the doped protection layer 224D is left over the surface of the first conductive structure 216.

Figure 2F:
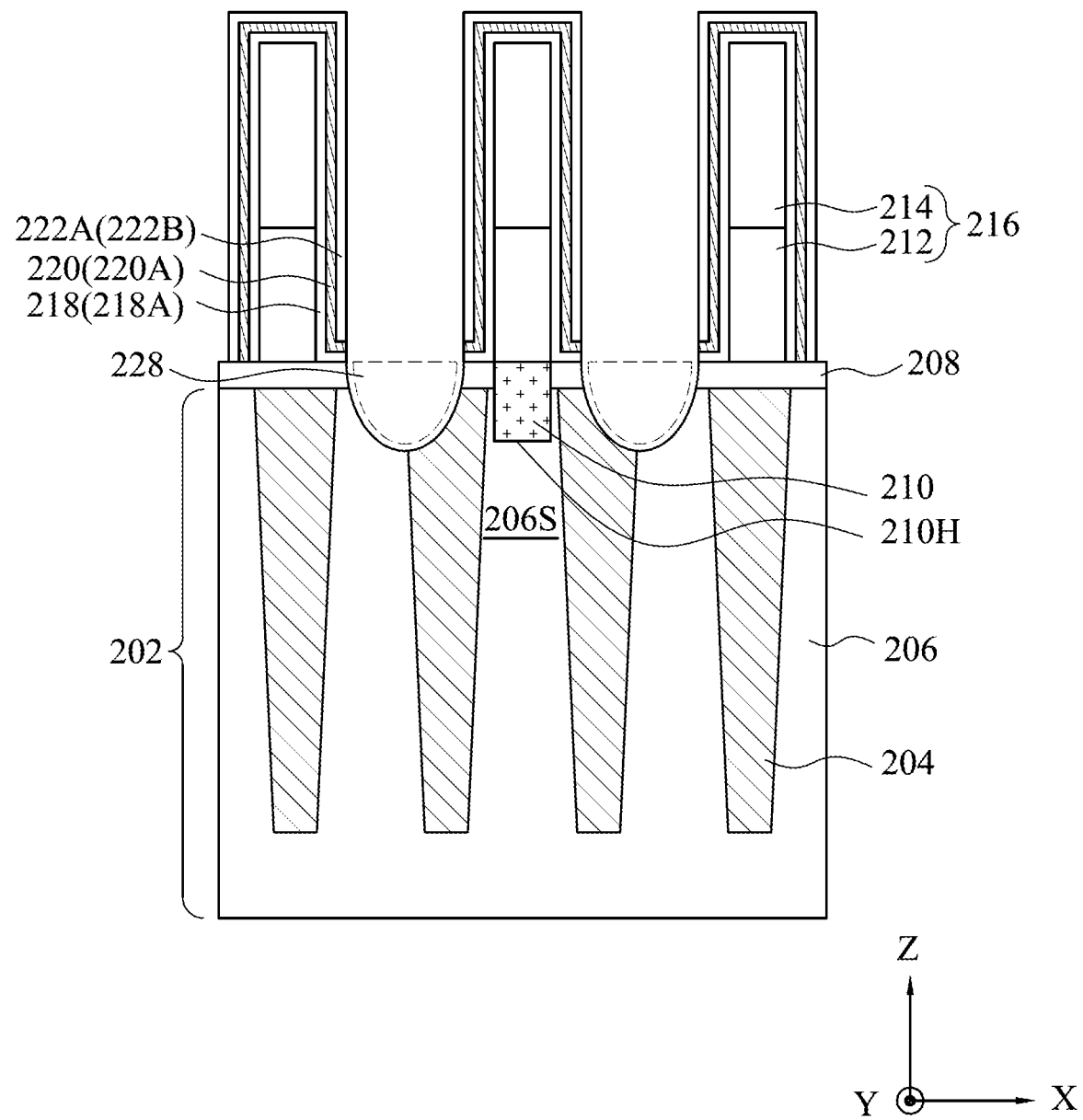

Referring to FIG. 2F, an additional etching process is performed to form a plurality of contact holes 228 between the first conductive structures 216. The contact holes 228 may be formed by removing the lateral sections of the first spacer layer 218A, the sacrificial layer 220A, the second spacer layer 222B, portions of the underlying insulation layer 208, and substrate 202 that are free from being covered by the doped protection layer 226D, which serves as a consuming mask during the etching process. Therefore, a portion of isolation areas 204 of the substrate 202 and a portion of active areas 206 of the substrate 202 are exposed due to a formation of the contact holes 228. The resulting first spacer layer 218, the resulting sacrificial layer 220 and the resulting second spacer layer 222A are on the surface of the first conductive structures 216. In some embodiments, during the formation of the contact holes 228, the doped protection layer 226D which serves as the consuming mask during the etching process may simultaneously be removed.

Figure 2G:
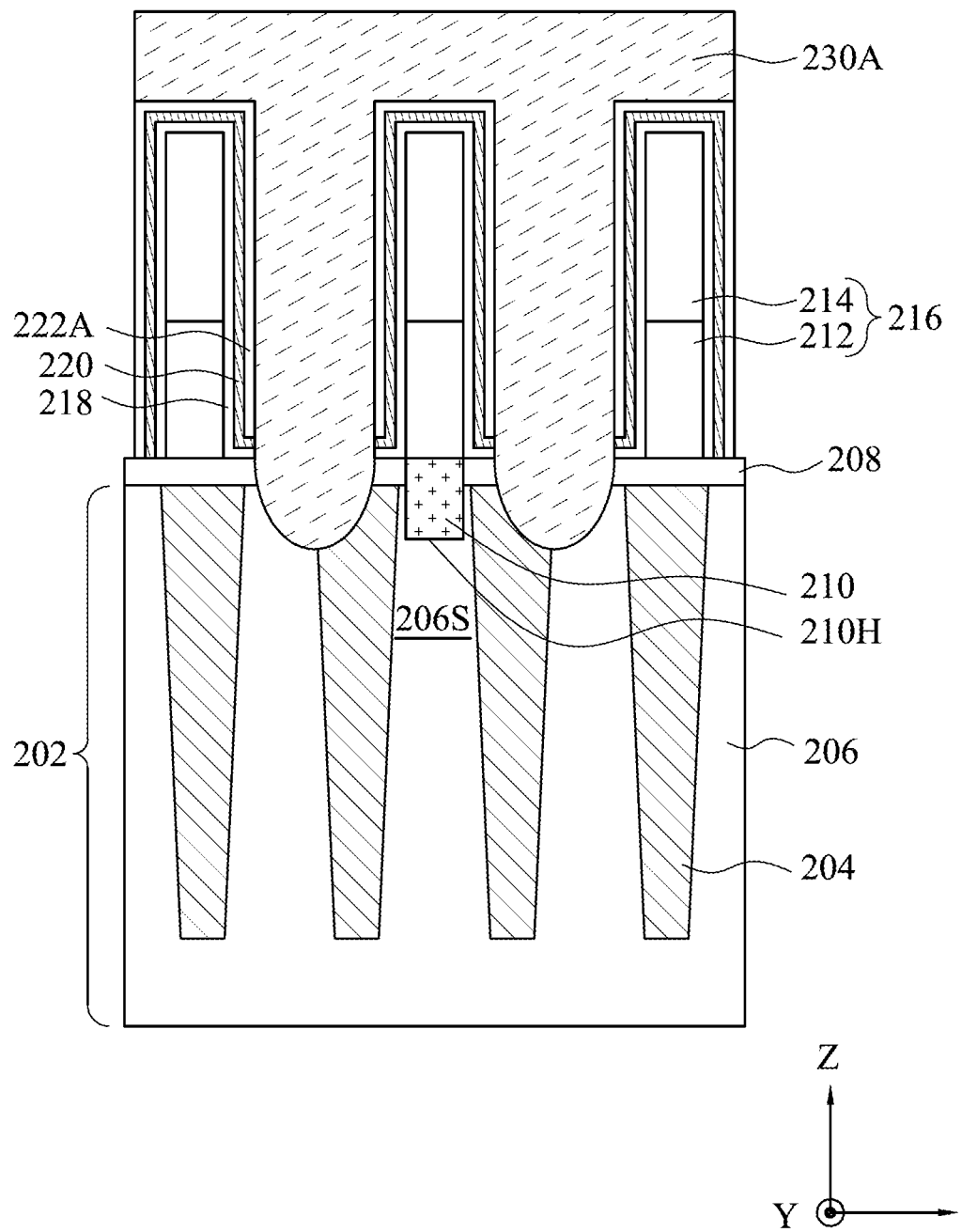

Referring to FIG. 2G, a second conductive layer 230A is formed to gap-fill the contact holes 228. The second conductive layer 230A includes a silicon-containing material. In some embodiments, the second conductive layer 230A may include doped polysilicon.

Figure 2H:
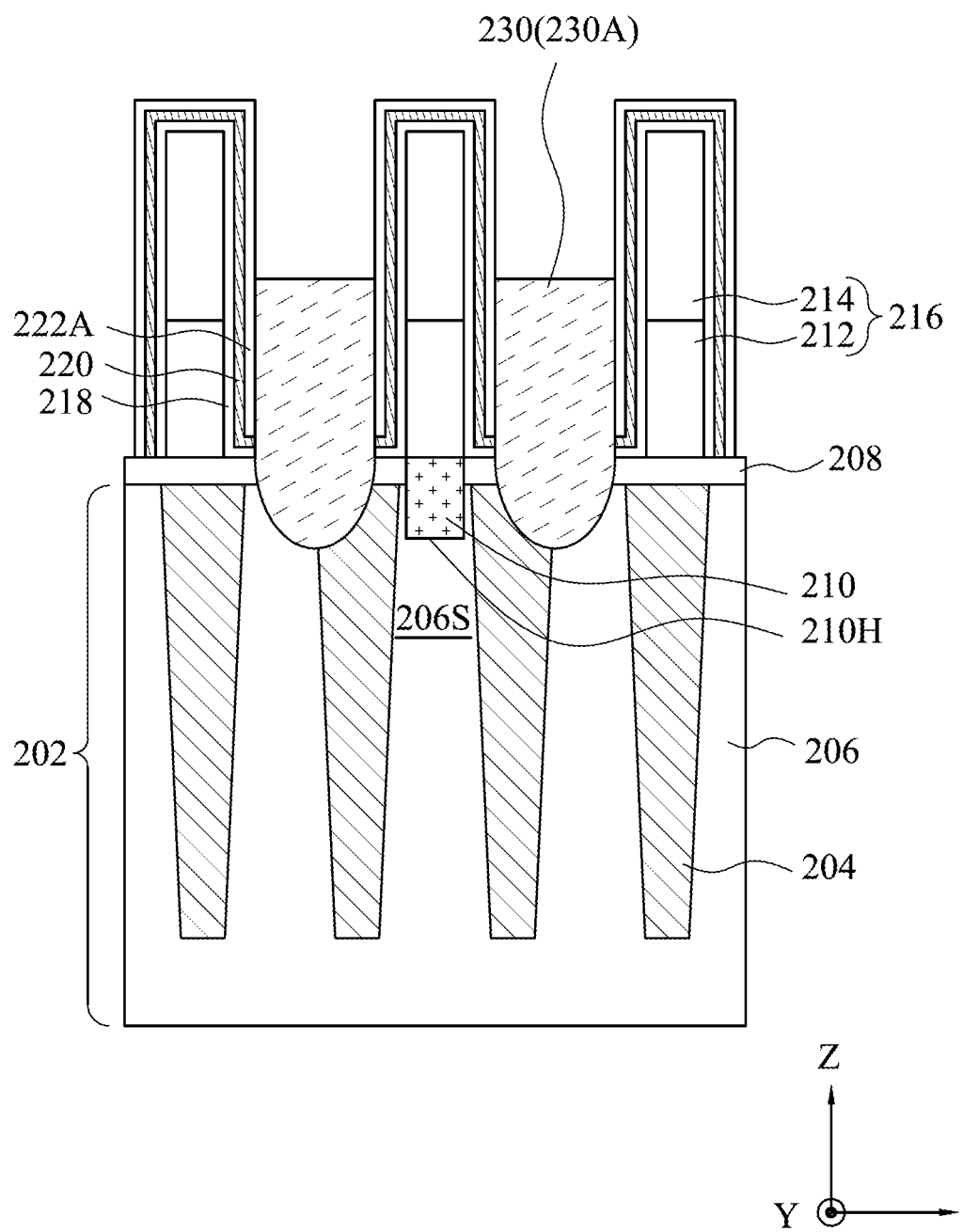

Referring to FIG. 2H, the second conductive layer 230A is etched back, so that a recessed second conductive layer 230 is formed between the first conductive structures 216. The formation of the recessed second conductive layer 230 may include a selective etch process. That is, in the etch process applied on the second conductive layer 230A, the second spacer layer 222A are not etched because of an etch selectivity with respect to the second conductive layer 230. In some embodiments, a dry etch-back process is applied.

A top surface of the recessed second conductive layer 230 has a level less than the top surface of the first conductive structure 116. The top surface of the recessed second conductive layer 230 may be controlled to a level greater than a top surface of the first conductive layer 212. Accordingly, a parasitic capacitance between the first conductive layer 212 and second conductive layer 230 may be reduced. In some embodiments, the second conductive layer 230 becomes a contact plug. When the first conductive structures 216 are a plurality of bit line structures, the second conductive layers 230 may become a portion of a storage node contact plug.

Figure 2I:
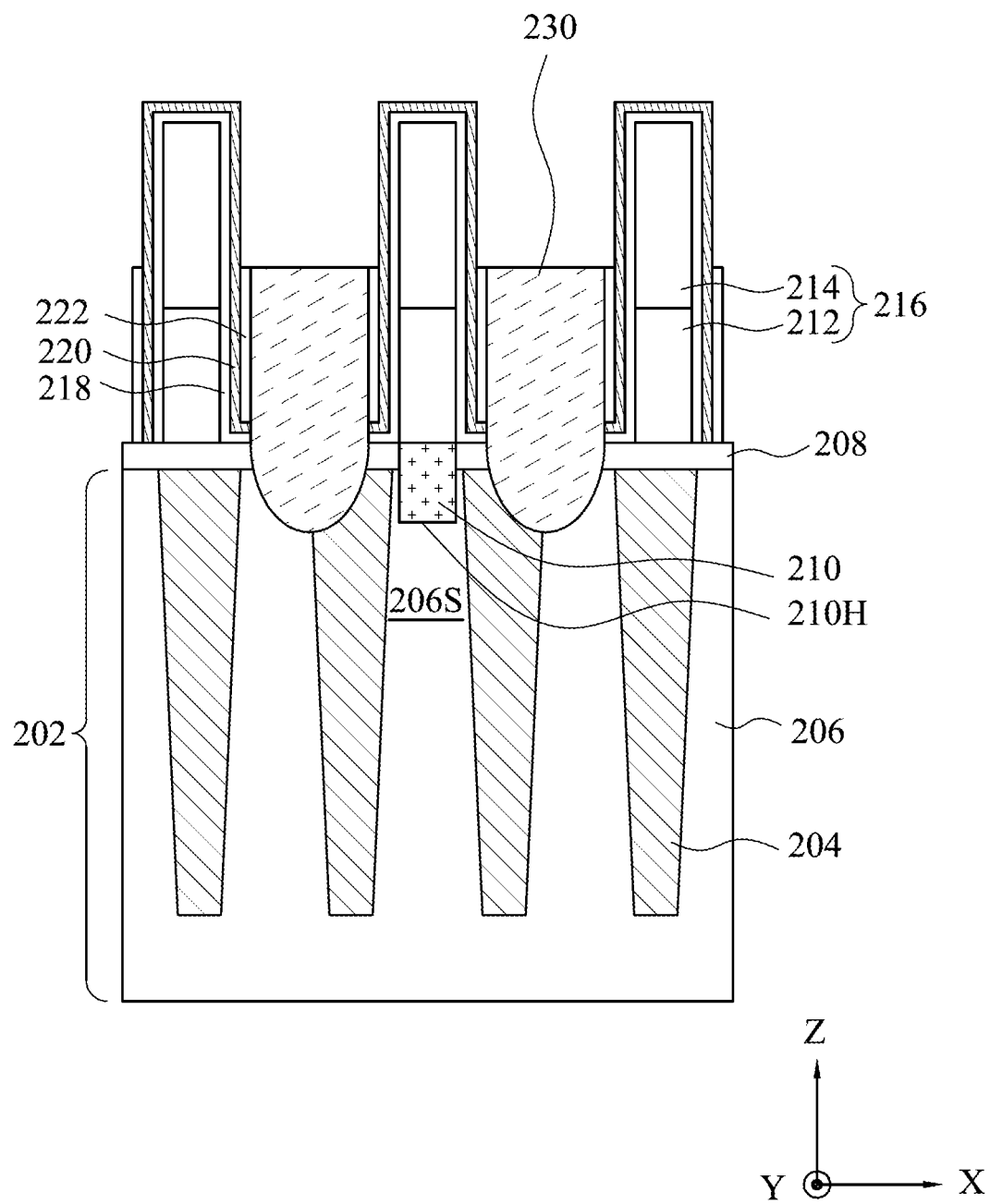

Referring to FIG. 2I, an etching process is performed, such that an upper portion of the second spacer layer 222A which does not contact the second conductive layer 230 is removed. The resulting second spacer layer 222 is located between the sacrificial layer 220 and the second conductive layer 230. The removing of the upper portion of the second spacer layer 222A may include a selective etching. In an embodiment, for the second spacer layer 222A containing silicon nitride, wet etch with phosphoric acid is applied because of an etch selectivity with respect to sacrificial layer 220 which includes oxide.

Figure 2J:
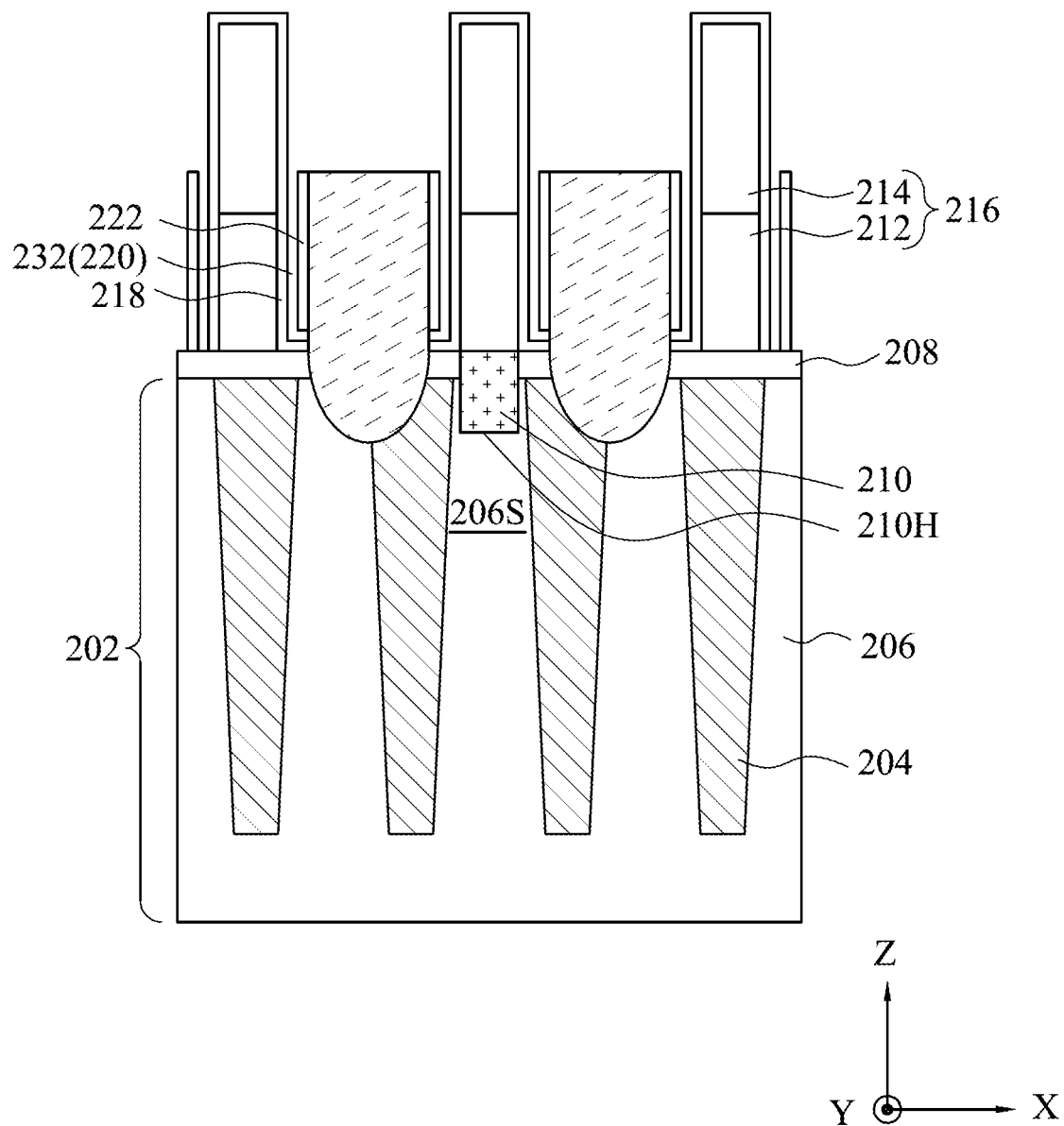

Referring to FIG. 2J, the sacrificial layers 220 are selectively removed and consequently a plurality of air gaps 232 are formed. The air gap 232 is formed between the first conductive layer 212, of which the first spacer layer 218 is on an outer surface, and the second conductive layer 230, of which the second spacer layer 222 is on one of sidewalls. The air gap 232 is formed at a substantially equal level to the top surface of the second conductive layer 230. Thus, an insulating structure of "first spacer layer 218-air gap 232-second spacer layer 222" is formed between the first conductive layer 212 and second conductive layer 230.

The removal of the sacrificial layer 220 may include a selective etching. The sacrificial layer 220 which includes oxide has an etch selectivity with respect to the first spacer layer 218, the second spacer layer 222 and the second conductive layer 230. In other words, the etching rate on the sacrificial layer 220 is higher than that on the first spacer layer 218, the second spacer layer 222 and the second conductive layer 230.

In some embodiments, a vapor etch process is applied for the sacrificial layer 220 with a thickness less than about 2 nm, and according the thickness of the air gap may be less than about 2 nm. In some embodiments, the vapor etch process includes hydrogen fluoride.

Figure 2K:
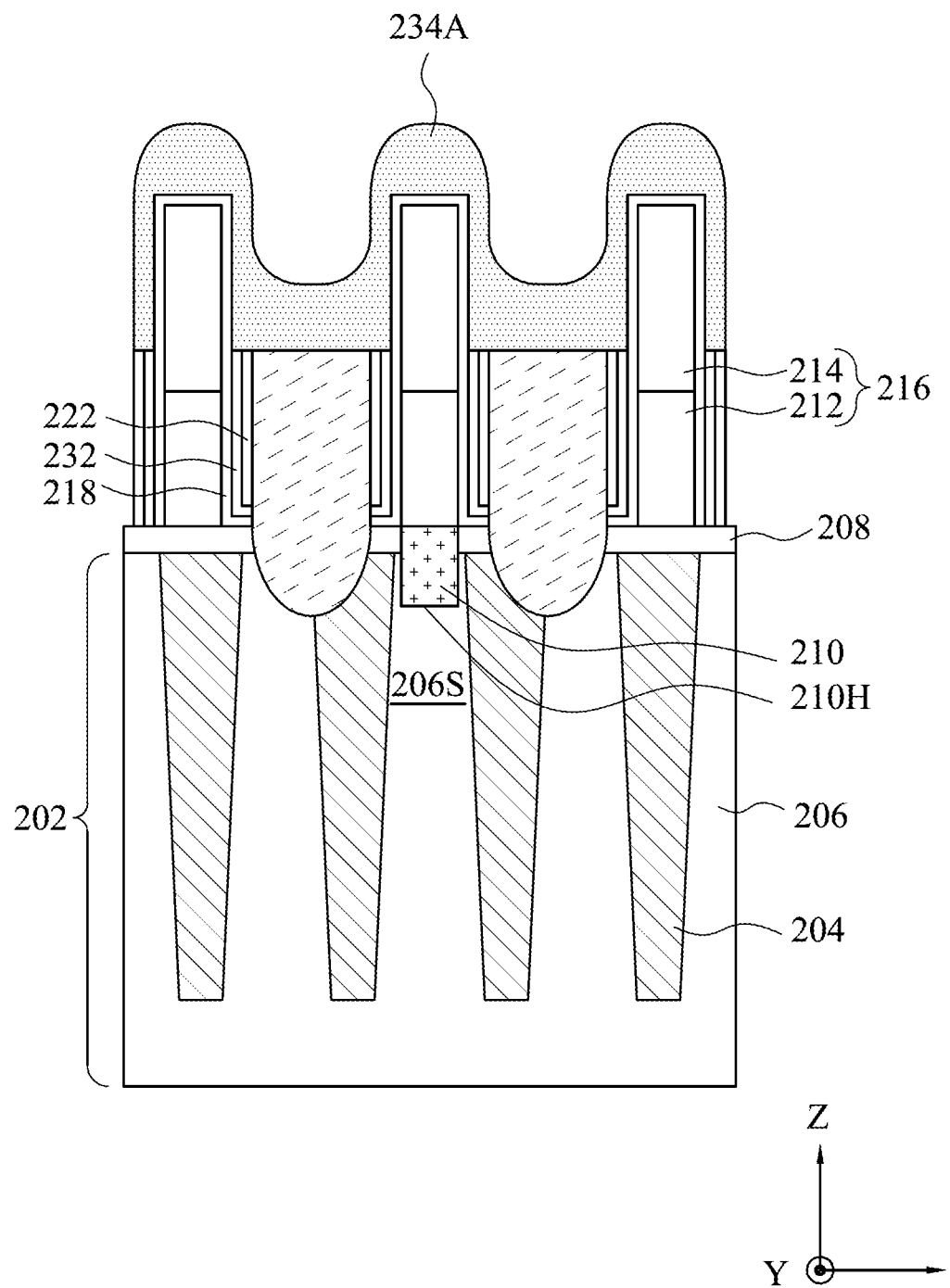

Referring to FIG. 2K, a capping layer 234A is deposited onto entire surface of resulting structure to cap the air gap 232. The capping layer 234A is formed over the first conductive structures 216 and the recessed second conductive layers 230. The deposition could apply any suitable approaches such as chemical vapor deposition (CVD) techniques, plasma-enhanced CVD (PECVD) techniques, or physical vapor deposition (PVD) techniques. The deposition process may be performed in a way of poor step coverage in order to cap an entrance opening of the air gap 232 rather than to block a path of the air gap 232. In some embodiments, the capping layer 234A is formed in a flow-like profile onto entire surface of resulting structures. The capping layer 234A may include a material substantially same as the first spacer layer 218 or the second spacer layer 222. In some embodiments, the capping layer 236A may include silicon nitride.

Figure 2L:
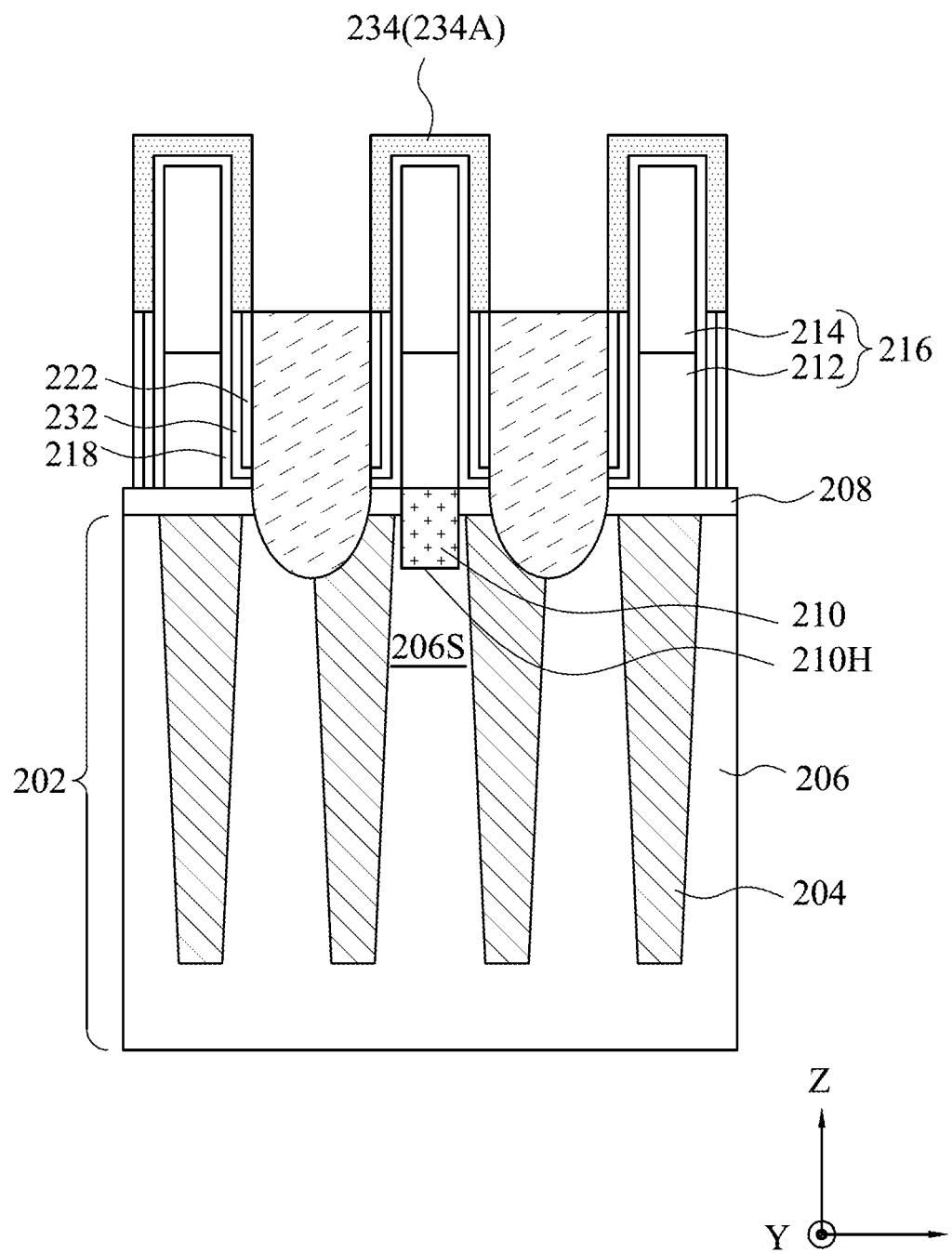

Referring to FIG. 2L, a capping layer 234 is further formed to expose the top surface of the second conductive layer 230 through an etch process on the capping layer 234A as mentioned above. The capping layer 234 may cover an upper portion of the first conductive structures 216 above a level substantially equal to the top surface of the second conductive layer 230. An exposure of the top surface of the second conductive layer 230 can further be connected to another conductive structure (not illustrated herein) in a subsequent process. With capping layer 234, the air gap 232 may be protected from being opened during a subsequent process. The connection of the second conductive layer 230 and another conductive structure (not illustrated herein) onto the second conductive layer 230 is collectively referred to as a second conductive structure (not illustrated herein). The air gap 232 may keep having a dielectric constant of approximate 1 to reduce parasitic capacitance between the first conductive layer 212 and second conductive layer 230.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a first conductive structure over a substrate;
    successively forming a first spacer layer, a sacrificial layer, and a second spacer layer on the first conductive structure;
    forming a second conductive structure adjacent the first conductive structure and in contact with a lower portion of the second spacer layer;
    partially removing an upper portion of the second spacer layer to expose the sacrificial layer;
    removing the sacrificial layer through a vapor etch process to form an air gap between the lower portion of the second spacer layer and the first spacer layer; and
    forming a capping layer to cap the air gap by forming a capping material on the first conductive structure and the second conductive structure to cap the air gap, and etching back the capping material to expose a top surface of the second conductive structure.

2. The method of claim 1, wherein the sacrificial layer comprises a material having an etch selectivity with respect to the first spacer layer and the second spacer layer.

3. The method of claim 1, wherein the second spacer layer comprises a material having an etch selectivity with respect to the second conductive structure.

4. The method of claim 1, wherein a formation of the second conductive structure comprises:
    forming a protection layer comprising doped polysilicon on the first conductive structure, wherein a portion of the substrate is free from being covered by the protection layer comprising doped polysilicon;
    forming a contact hole at the portion of the substrate not covered by the protection layer comprising doped polysilicon; and
    depositing a conductive material into the contact hole.

5. The method of claim 4, wherein forming the protection layer comprises an ion implant process at a range of incident angles that are oblique relative to a surface of the substrate to direct a plurality of dopants to a top surface of the first conductive structure and to at least one sidewall of the first conductive structure.

6. The method of claim 4, wherein the protection layer comprising doped polysilicon comprises a plurality of boron-type dopants.

7. The method of claim 1, wherein a thickness of the air gap is less than about 2 nm.

8. The method of claim 1, wherein an etching gas of the vapor etch process comprises hydrogen fluoride.

9. The method of claim 1, wherein forming the capping material comprises a deposition way of poor step coverage.

10. The method of claim 1, wherein the capping layer comprises a material substantially same as the first spacer layer, the second spacer layer, or both thereof.

11. A method of fabricating a semiconductor device, comprising:
    forming a plurality of bit line structures over a substrate;
    forming a sacrificial layer on a surface of the bit line structures;
    forming a contact plug between the bit line structures;
    removing the sacrificial layer through a vapor etch process to form a plurality of air gaps between the bit line structures and the contact plug; and
    forming a capping layer to cap an entrance of each of the air gaps by forming a capping material on the plurality of bit line structures and the contact plug to cap the entrance of each of the air gaps, and etching back the capping material to expose a top surface of the contact plug.

12. The method of claim 11, further comprising forming a plurality of spacer layers on the surface of the bit line structures, wherein the sacrificial layer is sandwiched between the plurality of spacer layers.

13. The method of claim 12, wherein a portion of an outermost layer of the spacer layers not contacting the contact plug is etched to expose a portion of the sacrificial layer.

14. The method of claim 12, wherein a removing rate on the sacrificial layer is higher than a removing rate of the spacer layers.

15. The method of claim 11, wherein forming the contact plug comprises:
   forming a protection layer comprising doped polysilicon on the surface of the bit line structures, wherein a portion of the substrate is free from being covered by the protection layer;
   forming a contact hole at the portion of the substrate not covered by the protection layer; and
   depositing a conductive material into the contact hole.

16. The method of claim 15, wherein the protection layer comprises boron-doped polysilicon by an ion implant process.

17. The method of claim 16, wherein the ion implant process is performed at a range of incident angles that are oblique relative to a surface of the substrate to direct a plurality of dopants to the protection layer on the surface of the bit line structures.

18. The method of claim 11, wherein the sacrificial layer comprises a material having oxide.

19. The method of claim 11, wherein an etching gas of the vapor etch process comprises hydrogen fluoride.

* * * * *